United States Patent
Nishi et al.

(10) Patent No.: US 12,269,238 B2
(45) Date of Patent: Apr. 8, 2025

(54) MULTILAYER RESIN SUBSTRATE AND METHOD FOR PRODUCING SAME

(71) Applicant: Murata Manufacturing Co., Ltd., Nagaokakyo (JP)

(72) Inventors: Yoshimasa Nishi, Nagaokakyo (JP); Tomohiro Nagai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 280 days.

(21) Appl. No.: 18/081,801

(22) Filed: Dec. 15, 2022

(65) Prior Publication Data

US 2023/0119857 A1 Apr. 20, 2023

Related U.S. Application Data

(63) Continuation of application No. PCT/JP2021/023304, filed on Jun. 21, 2021.

(30) Foreign Application Priority Data

Jun. 24, 2020 (JP) ................................ 2020-108644

(51) Int. Cl.
  *B32B 15/08* (2006.01)
  *B32B 7/022* (2019.01)
  (Continued)

(52) U.S. Cl.
  CPC .............. *B32B 15/08* (2013.01); *B32B 7/022* (2019.01); *B32B 15/20* (2013.01); *H05K 1/0218* (2013.01);
  (Continued)

(58) Field of Classification Search
  None
  See application file for complete search history.

(56) References Cited

U.S. PATENT DOCUMENTS

2012/0097428 A1* 4/2012 Kato ............... H05K 1/0218
  174/250
2015/0296621 A1* 10/2015 Yosui ................ H01G 4/40
  174/258
(Continued)

FOREIGN PATENT DOCUMENTS

JP   2004207636 A   7/2004
JP   2006245122 A   9/2006
(Continued)

OTHER PUBLICATIONS

Yosui—WO 2014-115433 A1—PCT D5—IDS—MT—two different conductors—roughness—2014 (Year: 2014).*
(Continued)

Primary Examiner — John Vincent Lawler
(74) Attorney, Agent, or Firm — Keating & Bennett, LLP (57) ABSTRACT

A multilayer resin substrate includes resin layers that are laminated, a first copper foil on the resin layers and including first and second main surfaces having first and second surface roughnesses, respectively, and a second copper foil on the resin layers and including third and fourth main surfaces having third and fourth surface roughnesses, respectively. A distance between the first main surface and the second copper foil is shorter than a distance between the second main surface and the second copper foil. When the first, second, third, and fourth surface roughnesses are denoted as SR1, SR2, SR3, and SR4 respectively, a relationship SR1<SR3≤SR4<SR2 is satisfied.

20 Claims, 7 Drawing Sheets

(51) Int. Cl.
  *B32B 15/20* (2006.01)
  *H05K 1/02* (2006.01)
  *H05K 1/03* (2006.01)
  *H05K 3/46* (2006.01)

(52) U.S. Cl.
  CPC .......... *H05K 1/0237* (2013.01); *H05K 1/032* (2013.01); *H05K 3/4655* (2013.01); *B32B 2305/55* (2013.01); *B32B 2307/538* (2013.01); *B32B 2457/08* (2013.01); *H05K 2201/0141* (2013.01); *H05K 2201/0355* (2013.01)

(56) References Cited

U.S. PATENT DOCUMENTS

| | | | |
|---|---|---|---|
| 2018/0145391 A1* | 5/2018 | Gouchi | .................. H05K 3/365 |
| 2019/0357355 A1 | 11/2019 | Ohashi et al. | |
| 2021/0212203 A1 | 7/2021 | Kamitsubo et al. | |

FOREIGN PATENT DOCUMENTS

| | | | | |
|---|---|---|---|---|
| JP | 2016092561 A | 5/2016 | | |
| WO | 2012124421 A1 | 9/2012 | | |
| WO | WO-2014115433 A1 * | 7/2014 | ......... | H01F 17/0013 |
| WO | 2014125894 A1 | 8/2014 | | |
| WO | WO-2018066324 A1 * | 4/2018 | ............... | H05K 1/02 |
| WO | 2018163999 A1 | 9/2018 | | |
| WO | WO-2018163859 A1 * | 9/2018 | ............ | H01L 23/12 |
| WO | 2020071473 A1 | 4/2020 | | |

OTHER PUBLICATIONS

Yosui—WO 2018-066324 A1—PCT D1—MT—multilayer structure—2018 (Year: 2018).*
Ito—WO 2018-163859 A1—IDS—PCT D3—MT—multiple layers—roughness—2018 (Year: 2018).*
International Search Report in PCT/JP2021/023304, mailed Sep. 7, 2021, 4 pages.
Written Opinion in PCT/JP2021/023304, mailed Sep. 7, 2021, 4 pages.

* cited by examiner

MULTILAYER RESIN SUBSTRATE AND METHOD FOR PRODUCING SAME

CROSS REFERENCE TO RELATED APPLICATIONS

This application claims the benefit of priority to Japanese Patent Application No. 2020-108644 filed on Jun. 24, 2020 and is a Continuation Application of PCT Application No. PCT/JP2021/023304 filed on Jun. 21, 2021. The entire contents of each application are hereby incorporated herein by reference.

BACKGROUND OF THE INVENTION

1. Field of the Invention

The present invention relates to a multilayer resin substrate including a plurality of resin layers and a method for producing the multilayer resin substrate.

2. Description of the Related Art

An example of a conventional multilayer resin substrate is described in International Publication No. 2018/163999. This multilayer resin substrate includes a plurality of resin base materials that are laminated and a metal foil that is bonded on the resin base materials and on which a circuit pattern is formed.

Producing a multilayer resin substrate generally includes a copper clad substrate obtained by providing a copper foil on one surface of a resin base material. In order to support a copper foil on a resin base material, a roughening treatment is commonly applied on one surface of the copper foil and thus adhesion strength between the resin base material and the copper foil is increased.

However, surface roughness which can be achieved varies depending on a type of a copper foil and accordingly, desired surface roughness is not always obtained. For example, as for a rolled copper foil produced by a rolling method, surface roughness of one main surface is significantly small, but it is difficult to accurately roughen the other main surface. On the other hand, as for an electrolytic copper foil produced by electrolytic plating, surface roughness of one main surface is not so small, but it is possible to accurately roughen the other main surface.

SUMMARY OF THE INVENTION

Preferred embodiments of the present invention provide multilayer resin substrates and methods for producing such multilayer resin substrates in each of which an adhesion strength between a resin base material and a metal foil is ensured and design freedom with respect to surface roughness is improved.

A multilayer resin substrate according to a preferred embodiment of the present invention includes a plurality of resin layers that are laminated, a first metal foil on the plurality of resin layers and including first and second main surfaces having first and second surface roughnesses, respectively, and a second metal foil on the plurality of resin layers and including third and fourth main surfaces having third and fourth surface roughnesses, respectively, wherein, when the first surface roughness, the second surface roughness, the third surface roughness, and the fourth surface roughness are denoted as SR1, SR2, SR3, and SR4 respectively, a relationship SR1<SR3≤SR4<SR2 is satisfied.

A method for producing a multilayer resin substrate according to a preferred embodiment of the present invention includes preparing a first metal foil including first and second main surfaces having first and second surface roughnesses, respectively and a second metal foil including third and fourth main surfaces having third and fourth surface roughnesses, respectively, arranging the first metal foil on a main surface of a first resin base material so that the second main surface of the first metal foil faces the main surface of the first resin base material and arranging the second metal foil on a main surface of a second resin base material so that the fourth main surface of the second metal foil faces the main surface of the second resin base material, and laminating a plurality of resin base materials including the first resin base material and the second resin base material, wherein a distance between the first main surface and the second metal foil is shorter than a distance between the second main surface and the second metal foil, and, when the first surface roughness, the second surface roughness, the third surface roughness, and the fourth surface roughness are denoted as SR1, SR2, SR3, and SR4 respectively, a relationship SR1<SR3≤SR4<SR2 is satisfied.

According to preferred embodiments of the present invention, multilayer resin substrates in each of which an adhesion strength between a resin base material and a metal foil is ensured and design freedom with respect to surface roughness is improved are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be shown hereinafter with reference to the drawings. Each of the preferred embodiments is exemplary and partial substitution or combination of the configurations described in different preferred embodiments can be performed. Each preferred embodiment will provide description on points that differ from points described before that preferred embodiment. In particular, the same or corresponding advantageous effects obtained from the same or corresponding configuration will not be sequentially described in each preferred embodiment.

First Preferred Embodiment

Figure 1:
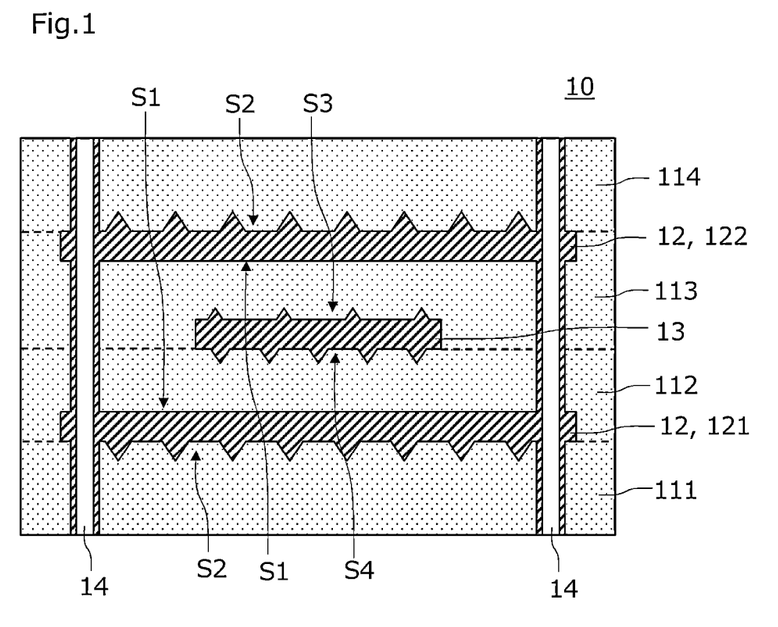
FIG. 1 is a schematic sectional view of a multilayer resin substrate 10 according to a first preferred embodiment of the present invention.

FIG. 1 is a schematic sectional view of a multilayer resin substrate 10 according to a first preferred embodiment of the present invention. The multilayer resin substrate 10 includes resin layers 111, 112, 113, and 114, a first copper foil 12, a second copper foil 13, and an interlayer connection conductor 14. The resin layers 111 to 114 are laminated in this order from a lower side to an upper side. The first copper foil 12 includes first copper foils 121 and 122. The first copper foil 121 is arranged on an upper surface of the resin layer 111. The first copper foil 122 is arranged on a lower surface of the resin layer 114. The second copper foil 13 is arranged on an upper surface of the resin layer 112. The first copper foil 121 and the first copper foil 122 are opposed to each other. The second copper foil 13 is arranged between the first copper foil 121 and the first copper foil 122. The interlayer connection conductor 14 penetrates through the resin layers 111 to 114 and connects the first copper foil 121 and the first copper foil 122 with each other.

The resin layers 111 to 114 are made of thermoplastic resin such as, for example, liquid crystal polymer, but may be made of other resin materials.

The interlayer connection conductor 14 is, for example, a through hole, but may be a via hole conductor obtained by solidifying or sintering conductive paste filled in a through hole.

In this specification, the terms "upper side" and "lower side" are used for convenience to distinguish one side from the other. Similarly, the terms "upper surface" and "lower surface" are used for convenience to distinguish a main surface on one side from a main surface on the other side.

The first copper foil 12 includes a first main surface S1 having a first surface roughness and a second main surface S2 having a second surface roughness. The second copper foil 13 includes a third main surface S3 having a third surface roughness and a fourth main surface S4 having a fourth surface roughness. When the first surface roughness, the second surface roughness, the third surface roughness, and the fourth surface roughness are denoted as SR1, SR2, SR3, and SR4 respectively, the relationship SR1<SR3<SR4<SR2 is satisfied. However, the relationship SR1<SR3≤SR4<SR2 may be satisfied. The present application employs the ten-point average roughness Rzjis (JIS B 0601-2001) as the parameter of surface roughness. Surface roughness can be evaluated based on a surface of a copper foil, for example.

The first main surface S1 of the first copper foil 121 is opposed to the fourth main surface S4 of the second copper foil 13. The first main surface S1 of the first copper foil 122 is opposed to the third main surface S3 of the second copper foil 13. The distance between the first main surface S1 of the first copper foil 121 and the second copper foil 13 is shorter than the distance between the second main surface S2 of the first copper foil 121 and the second copper foil 13. The distance between the first main surface S1 of the first copper foil 122 and the second copper foil 13 is shorter than the distance between the second main surface S2 of the first copper foil 122 and the second copper foil 13.

For example, the first copper foil 12 is a rolled copper foil and the second copper foil 13 is an electrolytic copper foil. The first main surface S1 of the first copper foil 12 and the third main surface S3 of the second copper foil 13 are surfaces to which the roughening treatment is not applied. The second main surface S2 of the first copper foil 12 and the fourth main surface S4 of the second copper foil 13 are surfaces to which the roughening treatment is applied. Surface roughness of a non-roughened surface of a rolled copper foil is smaller than surface roughness of a non-roughened surface of an electrolytic copper foil. Therefore, the relationship SR1<SR3 is satisfied. Surface roughness of a non-roughened surface of an electrolytic copper foil is smaller than surface roughness of a roughened surface of an electrolytic copper foil. Therefore, the relationship SR3<SR4 is satisfied. Accuracy in a roughening treatment with respect to an electrolytic copper foil is higher than accuracy in roughening treatment with respect to a rolled copper foil. As a result, surface roughness of a roughened surface of an electrolytic copper foil is smaller than surface roughness of a roughened surface of a rolled copper foil. Therefore, the relationship SR4<SR2 is satisfied.

Here, the first copper foil 12 and the second copper foil 13 are not limited to a rolled copper foil and an electrolytic copper foil respectively, but may be other types of copper foils whose surface roughness satisfies the above-described relationships.

The multilayer resin substrate 10 defines a high frequency transmission line and more specifically, defines a triplate transmission line. The triplate transmission line includes ground conductors that are opposed to each other and at least one signal line that is provided between the ground conductors. The ground conductors are defined by the first copper foils 121 and 122 and the signal line is defined by the second copper foil 13.

Figure 2A:
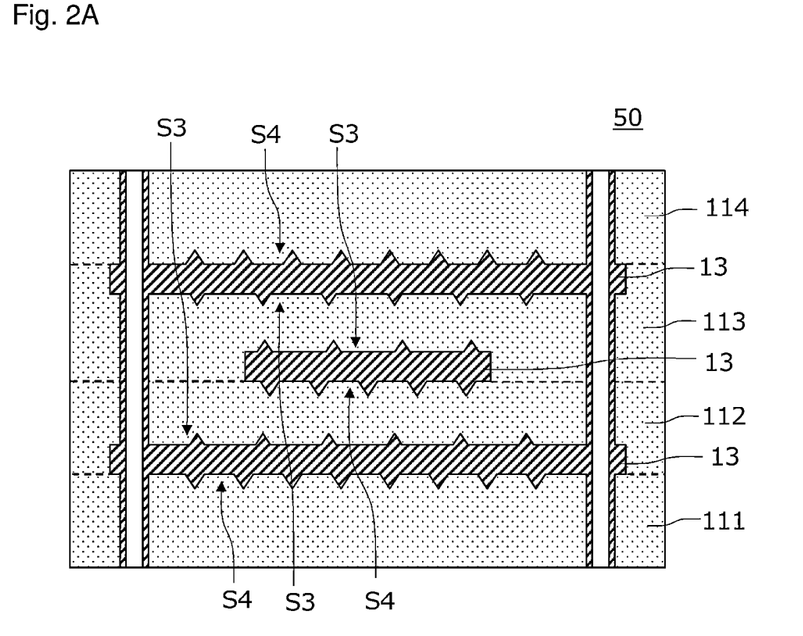
FIG. 2A is a schematic sectional view of a multilayer resin substrate 50 according to a first comparative example.
Figure 2B:
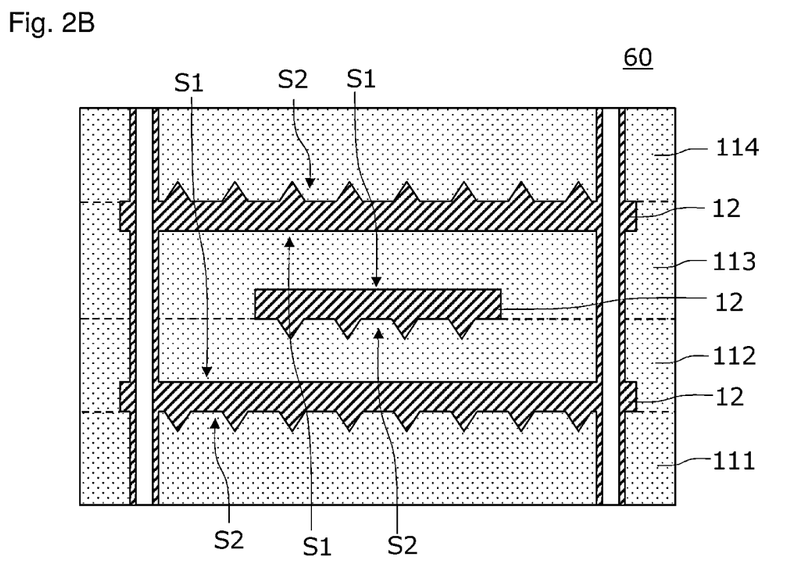
FIG. 2B is a schematic sectional view of a multilayer resin substrate 60 according to a second comparative example.

FIG. 2A is a schematic sectional view of a multilayer resin substrate 50 according to a first comparative example. FIG. 2B is a schematic sectional view of a multilayer resin substrate 60 according to a second comparative example. The multilayer resin substrate 50 is different from the multilayer resin substrate 10 according to the first preferred embodiment in that ground conductors are defined by the second copper foils 13. The multilayer resin substrate 60 is different from the multilayer resin substrate 10 according to the first preferred embodiment in that a signal line is defined by the first copper foil 12.

When a signal propagates through a triplate transmission line, current mainly flows on both main surfaces of a signal line and on a main surface, which is opposed to the signal line, of a ground conductor. As surface roughness of a surface on which current flows is larger, conductor loss increases.

In the multilayer resin substrate 10, the main surface, which is opposed to the signal line, of the ground conductor is the first main surface S1 of the first copper foil 12 and has the first surface roughness. In the multilayer resin substrate 50, the main surface, which is opposed to the signal line, of the ground conductor is the third main surface S3 of the second copper foil 13 and has the third surface roughness. Accordingly, the conductor loss of the triplate transmission line of the multilayer resin substrate 10 is smaller than the conductor loss of the triplate transmission line of the multilayer resin substrate 50.

The signal line of the multilayer resin substrate 10 is defined by the second copper foil 13. In this configuration, the surface roughness of both main surfaces of the signal line is relatively small and therefore, conductor loss is not so large. The signal line of the multilayer resin substrate 60 is defined by the first copper foil 12. In this configuration, current flows on the second main surface S2 of the first copper foil 12 defining the signal line, increasing conductor loss. Thus, the conductor loss of the triplate transmission line of the multilayer resin substrate 10 is smaller than the conductor loss of the triplate transmission line of the multilayer resin substrate 60.

According to the first preferred embodiment, a triplate transmission line having superior transmission characteristics can be provided by appropriately arranging the first main surface S1, whose surface roughness is smaller than others, and the second and third main surfaces S2 and S3, whose surface roughness is relatively small, as surfaces on which current flows. Here, the multilayer resin substrate 60 may define a microstrip transmission line. In this configuration, the number of the first copper foil 12 may be one.

Here, wiring, an inductor, a capacitor, or other structures may be provided in the multilayer resin substrate. In this configuration, the first copper foil 12 and the second copper foil 13 may be used differently as described below, for example. That is, the first copper foil 12 is used so as to utilize the first main surface S1 of the first copper foil 12. However, the second copper foil 13 is used for a portion on which characteristics of the multilayer resin substrate are deteriorated due to an influence of the second main surface S2 of the first copper foil 12 in the use of the first copper foil 12.

Figure 3A:
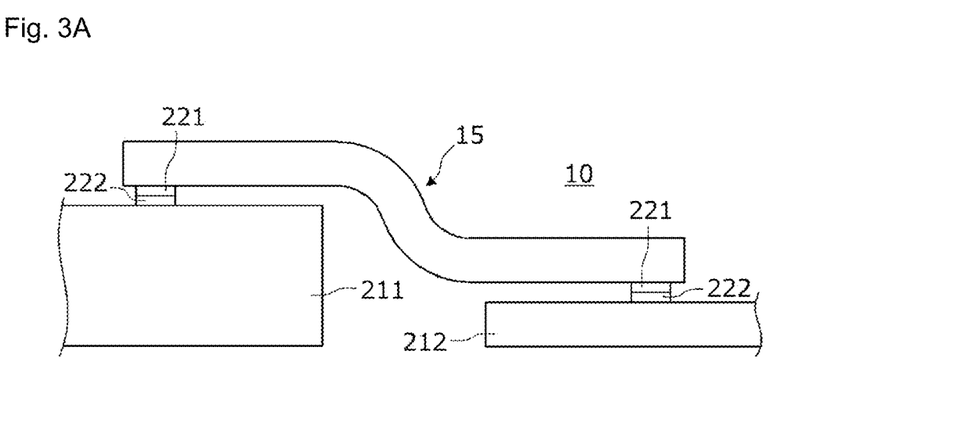
FIG. 3A is a schematic side view of a mounting structure of the multilayer resin substrate 10.

FIG. 3A is a schematic side view of a mounting structure of the multilayer resin substrate 10. The multilayer resin substrate 10 defines a high frequency transmission line as described above and may be mounted to electrically connect a circuit board 211 and a circuit board 212 with each other. A connector 221 is provided to the multilayer resin substrate 10 and a connector 222 is provided to the circuit boards 211 and 212. The connector 221 is electrically connected with the connector 222. The multilayer resin substrate 10 may include a bent portion 15. Accordingly, even when the connector 222 of the circuit board 211 and the connector 222 of the circuit board 212 are arranged at different heights, the multilayer resin substrate 10 is easily mounted.

Figure 3B:
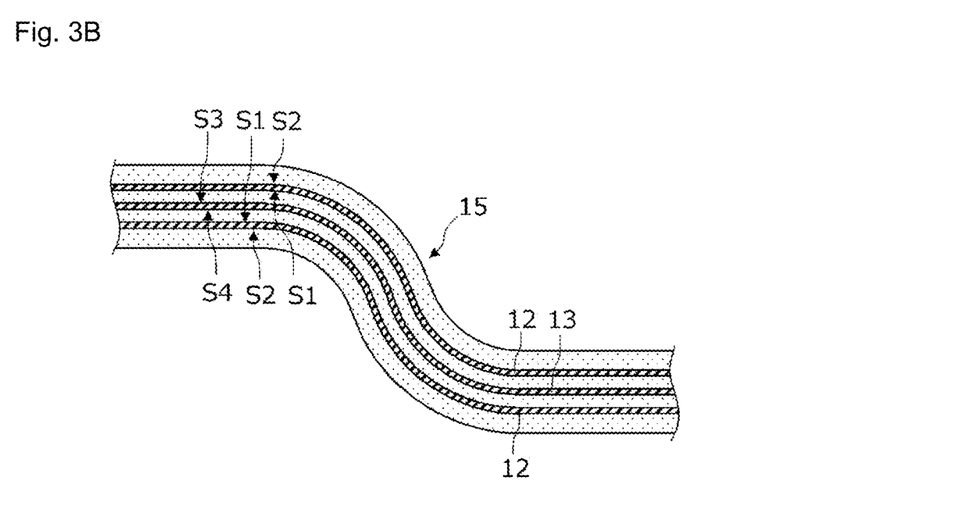
FIG. 3B is a side sectional view schematically illustrating a bent portion 15 of the multilayer resin substrate 10.

FIG. 3B is a side sectional view schematically illustrating the bent portion 15 of the multilayer resin substrate 10. The second main surface S2 of the first copper foil 12 is closest to the surface layer of the multilayer resin substrate 10 among main surfaces of copper foils arranged in the multilayer resin substrate 10.

In a state in which a multilayer resin substrate is bent, the closer to a surface layer of the multilayer resin substrate, the greater the stress. As a result, the closer to a surface layer of a multilayer resin substrate, the more likely delamination between a copper foil and a resin layer occurs.

According to the first preferred embodiment, the second main surface S2 of the first copper foil 12 is closest to the surface layer of the multilayer resin substrate 10 as described above. The second surface roughness of the second main surface S2 of the first copper foil 12 is larger than others and therefore, the adhesion strength between the second main surface S2 of the first copper foil 12 and the resin layer is larger than others. Accordingly, even when the multilayer resin substrate 10 is bent, delamination between the copper foil and the resin layer is reduced or prevented.

Further, since the first copper foils 12, 121, and 122 and the second copper foil 13 are copper foils, the multilayer resin substrate 10 can be produced at low cost.

FIGS. 4A, 4B, 5A, 5B, 6A, and 6B are schematic sectional views illustrating a non-limiting example of a method for producing the multilayer resin substrate 10 according to the first preferred embodiment.

FIGS. 4A to 6B illustrate a process for producing one multilayer resin substrate 10 for convenience. However, individual multilayer resin substrates 10 are produced by dividing a collective board, on which structures of a plurality of multilayer resin substrates 10 are formed, into individual pieces, in practice.

Figure 4A:
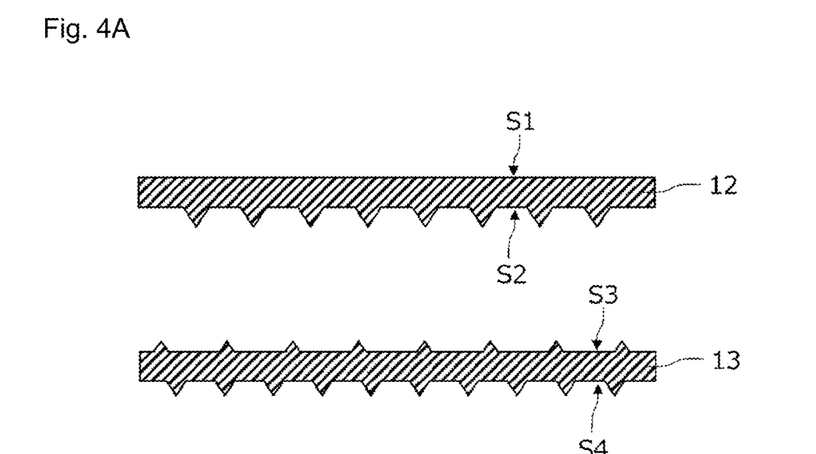
FIGS. 4A and 4B are schematic sectional views illustrating a method for producing the multilayer resin substrate 10 according to the first preferred embodiment of the present invention.

As illustrated in FIG. 4A, the first copper foil 12 and the second copper foil 13 are first prepared. For example, the first copper foil 12 is produced by a rolling method. Specifically, after forming a copper foil by repeating ingot casting, hot rolling, cold rolling, and annealing, a roughening treatment by electrolytic plating is performed. For example, the second copper foil 13 is produced by electrolytic plating. Specifically, an electrolytic solution is poured between a drum-shaped cathode and an anode opposed to the cathode, and current is applied so as to deposit copper on the surface of the cathode. After the copper is peeled off as a copper foil from the surface of the cathode, the roughening treatment using electrolytic plating is performed.

Figure 4B:
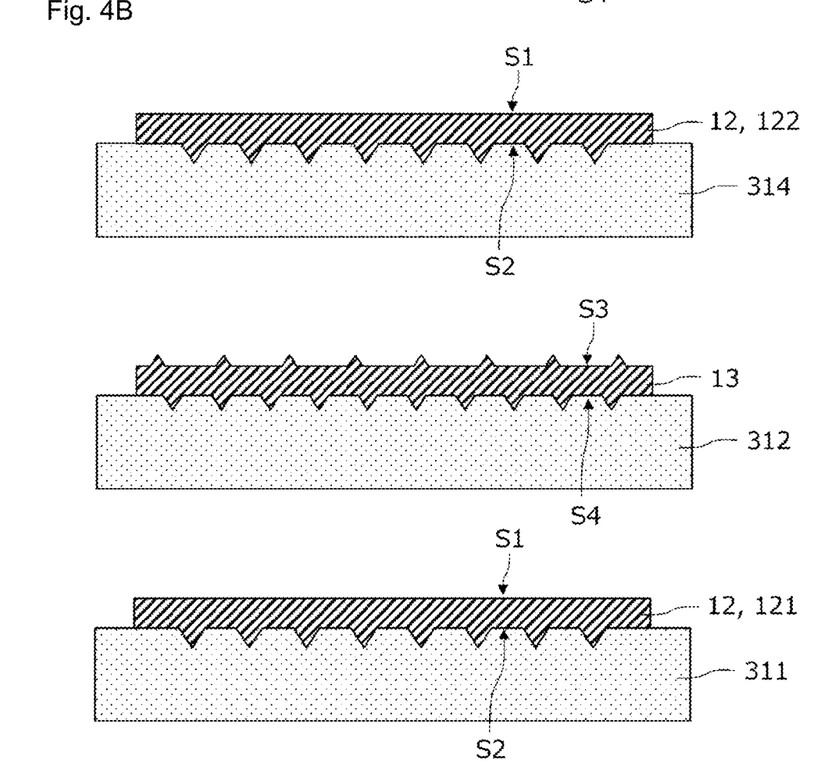

Then, as illustrated in FIG. 4B, the first copper foil 121 and a resin base material (resin sheet) 311 are press-bonded by, for example, roll-pressing the first copper foil 121 and the resin base material 311 while heating, forming a copper clad substrate. In a similar manner, the second copper foil 13 and a resin base material 312 are press-bonded. The first copper foil 122 and a resin base material 314 are press-bonded. The resin base materials 311 and 314 are examples of a "first resin base material". The resin base material 312 is an example of a "second resin base material". At this time, the first copper foil 121 is arranged on a main surface of the resin base material 311 so that the second main surface S2 of the first copper foil 121 faces the main surface of the resin base material 311. The second copper foil 13 is arranged on a main surface of the resin base material 312 so that the fourth main surface S4 of the second copper foil 13 faces the main surface of the resin base material 312. The first copper foil 122 is arranged on a main surface of the resin base material 314 so that the second main surface S2 of the first copper foil 122 faces the main surface of the resin base material 314.

Figure 5A:
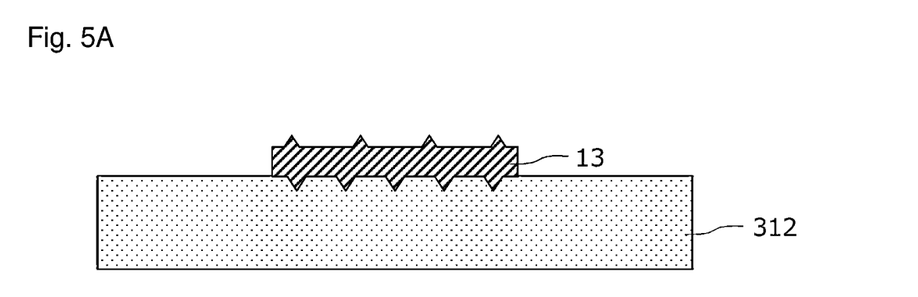
FIGS. 5A and 5B are schematic sectional views illustrating the method for producing the multilayer resin substrate 10.

Subsequently, as illustrated in FIGS. 4B and 5A, the first copper foils 121 and 122 and the second copper foil 13 are patterned with the photolithography techniques, for example. FIG. 5A omits illustration of the resin base materials 311 and 314 on which the first copper foils 121 and 122 are respectively provided.

Figure 5B:
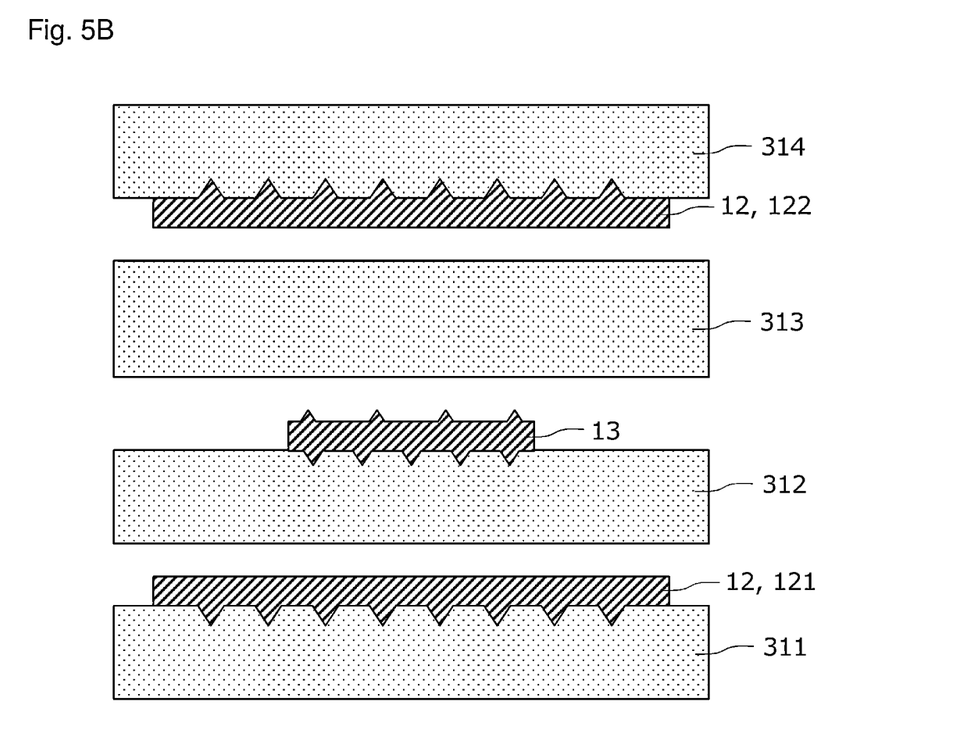
Figure 6A:
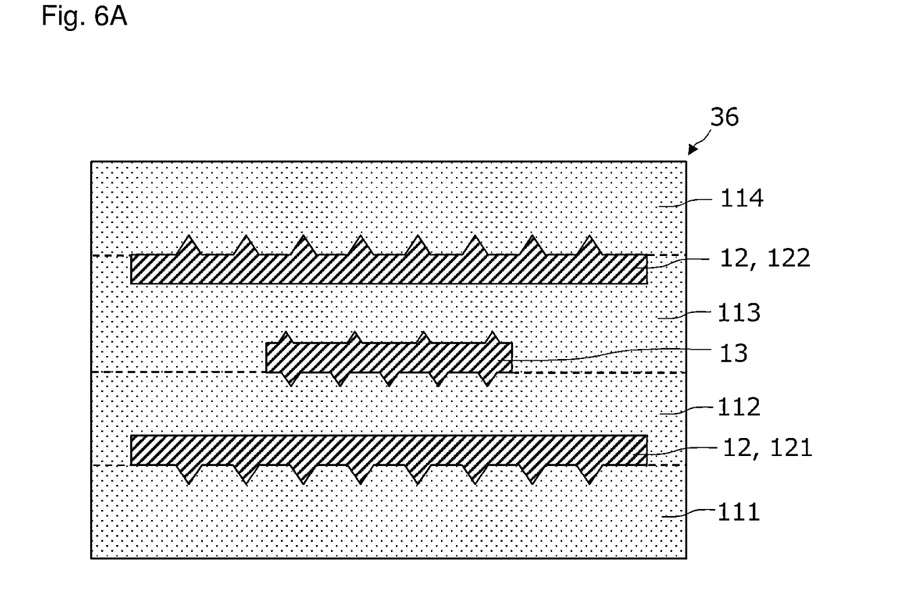
FIGS. 6A and 6B are schematic sectional views illustrating the method for producing the multilayer resin substrate 10.

Then, as illustrated in FIGS. 5B and 6A, the resin base materials 311, 312, 313, and 314 are stacked. After that, the resin base materials 311 to 314 are collectively press-bonded by roll-pressing the resin base materials 311 to 314 while heating, forming a multilayer body 36.

Figure 6B:
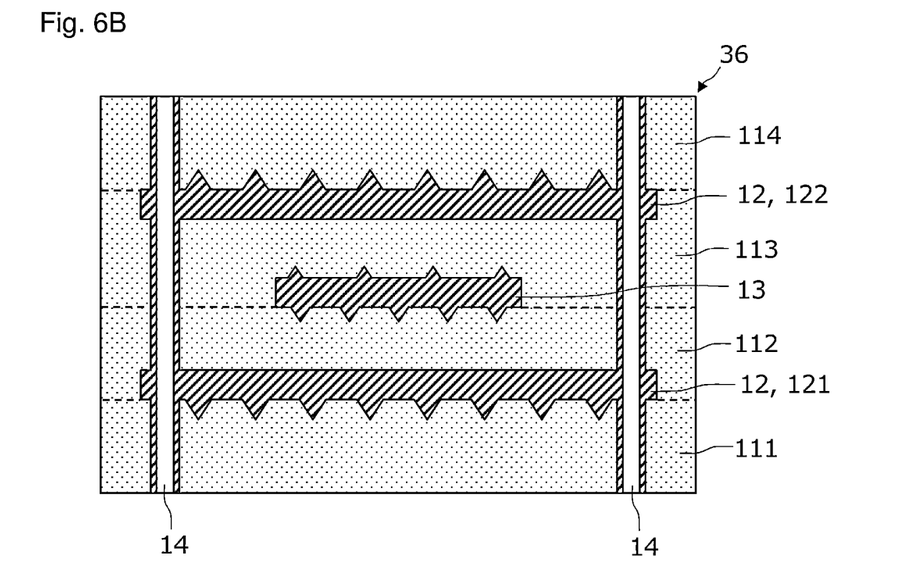

Subsequently, as illustrated in FIG. 6B, through holes are formed in the multilayer body 36 and copper plating is applied to inner walls of the through holes so as to form the interlayer connection conductors 14. Thus, the multilayer resin substrate 10 is obtained.

According to the first preferred embodiment, the relationship $SR1 < SR3 \leq SR4 < SR2$ is satisfied. The first copper foil 12 is supported by the resin base material so that the second main surface S2 of the first copper foil 12 faces the main surface of the resin base material, and the second copper foil 13 is supported by a resin base material so that the third main surface S3 or the fourth main surface S4 of the second copper foil 13 faces the main surface of the resin base material. Accordingly, the adhesion strength between the copper foils and the resin base materials is improved.

The fourth surface roughness of the fourth main surface S4 of the second copper foil 13 is larger than the third surface roughness of the third main surface S3 of the second copper foil 13. The first copper foil 12 is supported by a resin base material so that the second main surface S2 of the first copper foil 12 faces the main surface of the resin base material, and the second copper foil 13 is supported by a resin base material so that the fourth main surface S4 of the second copper foil 13 faces the main surface of the resin base material. Accordingly, the adhesion strength between the copper foils and the resin base materials is further improved.

Further, according to the first preferred embodiment, the first copper foil 12 and the second copper foil 13 that have mutually-different surface roughness are used as copper foils. Design freedom with respect to surface roughness is improved by differently using the first copper foil 12 and the second copper foil 13.

Further, a triplate transmission line with superior transmission characteristics can be obtained by appropriately arranging the first copper foil 12 and the second copper foil 13, as described above.

Second Preferred Embodiment

Figure 7:
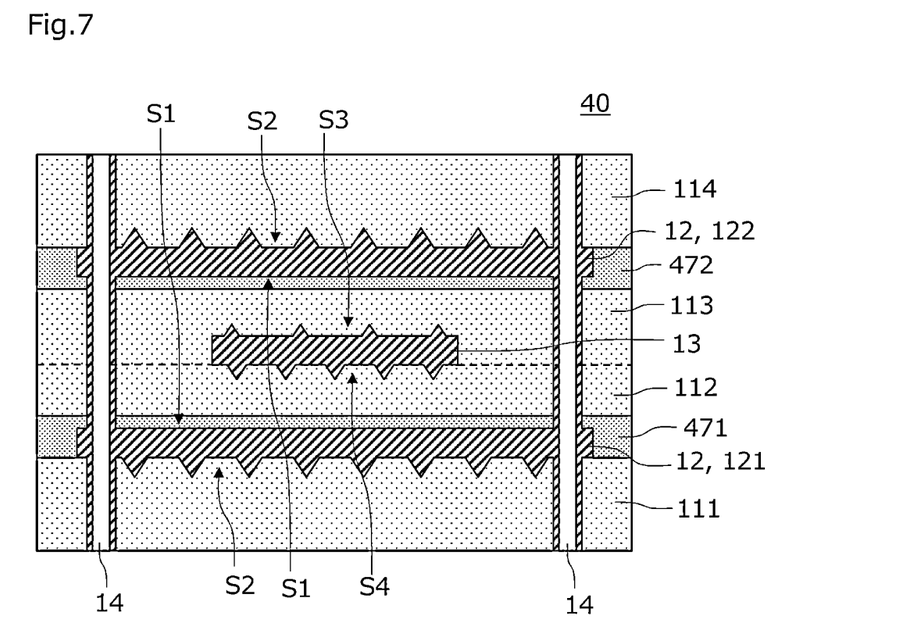
FIG. 7 is a schematic sectional view of a multilayer resin substrate 40 according to a second preferred embodiment of the present invention.

FIG. 7 is a schematic sectional view of a multilayer resin substrate 40 according to a second preferred embodiment of the present invention. The multilayer resin substrate 40 is different from the multilayer resin substrate 10 according to the first preferred embodiment in that the multilayer resin substrate 40 further includes resin layers 471 and 472.

The resin layer 112 faces the first main surface S1 of the first copper foil 121. The resin layer 471 is arranged between the first copper foil 121 and the resin layer 112 and is in contact with the first copper foil 121 and the resin layer 112. The resin layer 471 is made of a material having different characteristics from the material of the resin layers 111 to 114. For example, the resin layers 111 to 114 are liquid crystal polymer and the resin layer 471 is epoxy resin. The resin layer 471 defines and functions as an adhesive layer that improves bonding between the first copper foil 121 and the resin layer 112. In the same or similar manner, the resin layer 472 is made of a material having different characteristics from the material of the resin layers 111 to 114. The resin layer 472 defines and functions as an adhesive layer that improves bonding between the first copper foil 122 and the resin layer 113. The resin layers 112 and 113 are examples of a "first resin layer". The resin layers 471 and 472 are examples of a "second resin layer".

Here, a resin layer defining and functioning as an adhesive layer may be provided between the second copper foil 13 and the resin layer 113.

The first surface roughness of the first main surface S1 of the first copper foil 121 is smaller than others. Therefore, in a configuration in which the resin layer 112 is directly bonded to the first main surface S1 of the first copper foil 121, the resin layer 112 is easily peeled off from the first main surface S1 of the first copper foil 121. As a result, the resin layer 112 is easily peeled off from the resin layer 111. In the same or similar manner, in a configuration in which the resin layer 113 is directly bonded to the first main surface S1 of the first copper foil 122, the resin layer 113 is easily peeled off from the resin layer 114.

According to the second preferred embodiment, the resin layer 112 is bonded to the first main surface S1 of the first copper foil 121 with the resin layer 471 interposed therebetween and therefore, delamination between the resin layers 111 and 112 is reduced or prevented. In the same or similar manner, delamination between the resin layers 113 and 114 is reduced or prevented.

Finally, the description of the preferred embodiments described above is exemplary in all respects and not restrictive. Those skilled in the art can appropriately make modifications and alterations. The scope of the present invention is indicated by the claims rather than the preferred embodiments described above. Further, the scope of the present invention includes changes from the preferred embodiments within the equivalent scope to the scope of the claims.

The resin layers of the multilayer resin substrates 10 and 40 can be removed by a solvent, for example. Accordingly, the surface roughness of the first copper foil 12 and the surface roughness of the second copper foil 13 can be measured.

The first copper foils 12, 121, and 122 and the second copper foil 13 may be a metal foil. The metal foil may be, for example, metal other than copper (for example, aluminum).

It is sufficient that the first copper foils 12, 121, and 122 and the second copper foil 13 is mainly made of copper foil. Accordingly, the first copper foils 12, 121, and 122 and the second copper foil 13 may be a metal foil obtained by plating a surface of a copper foil for corrosion protection. The metal foil may be, for example, metal other than copper (for example, aluminum).

The first copper foil 12 and the second copper foil 13 may be signal lines. In this configuration, the first copper foil 12 and the second copper foil 13 define a differential transmission line. It is sufficient that the first main surface S1 having small surface roughness faces the second copper foil 13. This reduces loss occurring on the first copper foil 12.

Here, two or more second copper foils 13 may be aligned in a horizontal direction of FIG. 1 between the first copper foils 121 and 122 that are ground conductors. The two or more second copper foils 13 are signal lines. The two or more second copper foils 13 form a differential transmission line.

Also, two or more second copper foils 13 may be aligned in a vertical direction of FIG. 1. In this configuration, the two or more second copper foils 13 are positioned between the first copper foil 121 and the first copper foil 122. The two or more second copper foils 13 are signal lines. The two or more second copper foils 13 define a differential transmission line.

Further, three or more second copper foils 13 may be aligned in the horizontal direction of FIG. 1. The second copper foil 13 positioned on the left end and the second copper foil 13 positioned on the right end are ground conductors. The rest of the second copper foils 13 are signal lines.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer resin substrate comprising:
 a plurality of resin layers that are laminated;
 a first metal foil on the plurality of resin layers and including first and second main surfaces having first and second surface roughnesses, respectively; and a second metal foil on the plurality of resin layers and including third and fourth main surfaces having third and fourth surface roughnesses, respectively; wherein when the first surface roughness, the second surface roughness, the third surface roughness, and the fourth surface roughness are denoted as SR1, SR2, SR3, and SR4, respectively, a relationship SR1<SR3≤SR4<SR2 is satisfied.

2. The multilayer resin substrate according to claim 1, wherein the first metal foil is a rolled metal foil and the second metal foil is an electrolytic metal foil.

3. The multilayer resin substrate according to claim 1, wherein the plurality of resin layers include liquid crystal polymer.

4. The multilayer resin substrate according to claim 1, wherein the multilayer resin substrate includes a bent portion.

5. The multilayer resin substrate according to claim 4, wherein the second main surface of the first metal foil is closest to a surface layer of the multilayer resin substrate among main surfaces of metal foils in the multilayer resin substrate.

6. The multilayer resin substrate according to claim 1, wherein a high frequency transmission line is provided.

7. The multilayer resin substrate according to claim 6, wherein
a triplate transmission line including at least one signal line is provided; and
the at least one signal line is defined by the second metal foil.

8. The multilayer resin substrate according to claim 7, wherein
a distance between the first main surface and the second metal foil is shorter than a distance between the second main surface and the second metal foil; and
a ground conductor is defined by the first metal foil.

9. The multilayer resin substrate according to claim 1, wherein
the plurality of resin layers include a first resin layer that faces the first main surface of the first metal foil and a second resin layer that is between the first metal foil and the first resin layer; and
the first resin layer and the second resin layer are made of materials whose characteristics are different from each other.

10. The multilayer resin substrate according to claim 1, wherein a relationship SR1<SR3<SR4<SR2 is satisfied.

11. The multilayer resin substrate according to claim 1, wherein the first metal foil and the second metal foil mainly include a copper foil.

12. The multilayer resin substrate according to claim 1, wherein a distance between the first main surface and the second metal foil is shorter than a distance between the second main surface and the second metal foil.

13. The multilayer resin substrate according to claim 1, wherein at least two of the first metal foils are provided;
the second metal foil is disposed between the at least two of the first metal foils;
each of the at least two first metal foils is a rolled metal foil; and
the second metal foil is an electrolytic metal foil.

14. A method for producing a multilayer resin substrate, the method comprising:
preparing a first metal foil including first and second main surfaces having first and second surface roughnesses, respectively and a second metal foil including third and fourth main surfaces having third and fourth surface roughnesses, respectively;
arranging the first metal foil on a main surface of a first resin base material so that the second main surface of the first metal foil faces the main surface of the first resin base material and arranging the second metal foil on a main surface of a second resin base material so that the fourth main surface of the second metal foil faces the main surface of the second resin base material; and
laminating a plurality of resin base materials including the first resin base material and the second resin base material; wherein
a distance between the first main surface and the second metal foil is shorter than a distance between the second main surface and the second metal foil; and
when the first surface roughness, the second surface roughness, the third surface roughness, and the fourth surface roughness are denoted as SR1, SR2, SR3, and SR4 respectively, a relationship SR1<SR3≤SR4<SR2 is satisfied.

15. The method for producing a multilayer resin substrate according to claim 14, wherein the first metal foil is a rolled metal foil and the second metal foil is an electrolytic metal foil.

16. The method for producing a multilayer resin substrate according to claim 14, wherein the plurality of resin base layers include liquid crystal polymer.

17. The method for producing a multilayer resin substrate according to claim 14, wherein the multilayer resin substrate includes a bent portion.

18. The method for producing a multilayer resin substrate according to claim 14, wherein a high frequency transmission line is defined.

19. The method for producing a multilayer resin substrate according to claim 18, wherein
a triplate transmission line including at least one signal line is defined; and
the at least one signal line is defined by the second metal foil.

20. The method for producing a multilayer resin substrate according to claim 14, wherein a relationship SR1<SR3<SR4<SR2 is satisfied.

* * * * *